United States Patent [19]

Ohtsuka et al.

[11] Patent Number: 4,905,194
[45] Date of Patent: Feb. 27, 1990

[54] SEMICONDUCTOR MEMORY DEVICE WITH A CIRCUIT FOR ANALYZING DEFECTS IN WORD-LINES

[75] Inventors: Nobuaki Ohtsuka; Junichi Miyamoto, both of Yokohama, Japan

[73] Assignee: Kabushiki Kaisha Toshiba, Kawasaki, Japan

[21] Appl. No.: 310,137

[22] Filed: Feb. 14, 1989

[30] Foreign Application Priority Data

Feb. 16, 1988 [JP] Japan ................................. 63-33436

[51] Int. Cl.$^4$ ............................................. G11C 11/40
[52] U.S. Cl. ............................... 365/185; 365/189.03; 365/200; 365/201; 365/230.06
[58] Field of Search ................... 365/201, 200, 189.01, 365/185, 182, 230.01, 230.06, 189.03, 189.04, 230.05; 371/10, 21

[56] References Cited

U.S. PATENT DOCUMENTS

| 4,713,814 | 12/1987 | Andrusch et al. | 365/201 |
| 4,718,042 | 1/1988 | Moll et al. | 365/201 |
| 4,720,818 | 1/1988 | Takeguchi | 365/201 |
| 4,779,272 | 10/1988 | Kohda et al. | 365/201 |
| 4,802,137 | 1/1989 | Okuda et al. | 365/201 |

Primary Examiner—Terrell W. Fears
Attorney, Agent, or Firm—Finnegan, Henderson, Farabow, Garrett and Dunner

[57] ABSTRACT

A semiconductor memory device of the invention includes a memory cell array including a plurality of memory cells, and a row decoder and a column decoder for selecting word-lines and bit-lines, respectively. The semiconductor memory device further includes a plurality of transistors having their gates connected to corresponding word-lines, their sources connected to a fixed potential source, and their drains connected commonly to a predetermined pad.

6 Claims, 2 Drawing Sheets

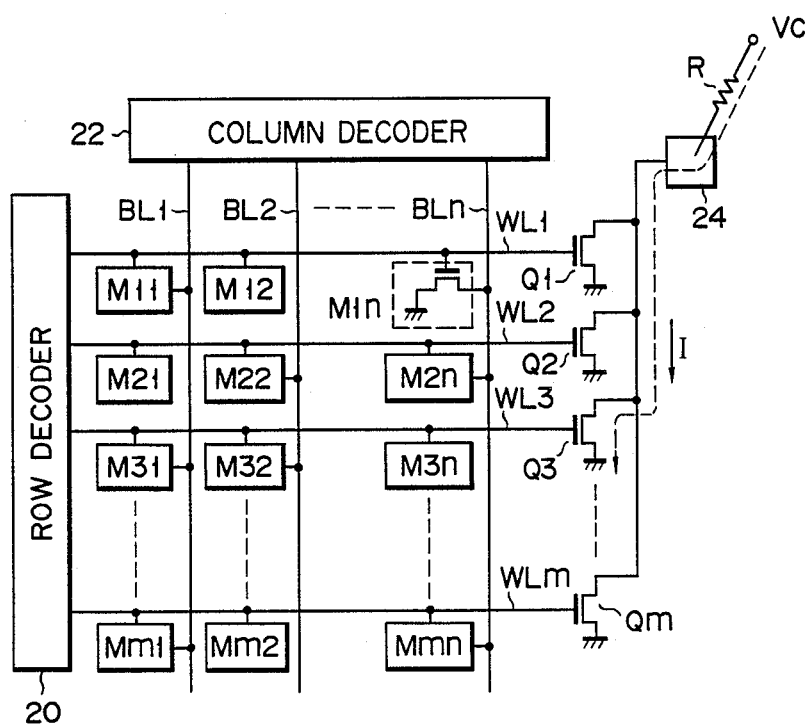
F I G. 1

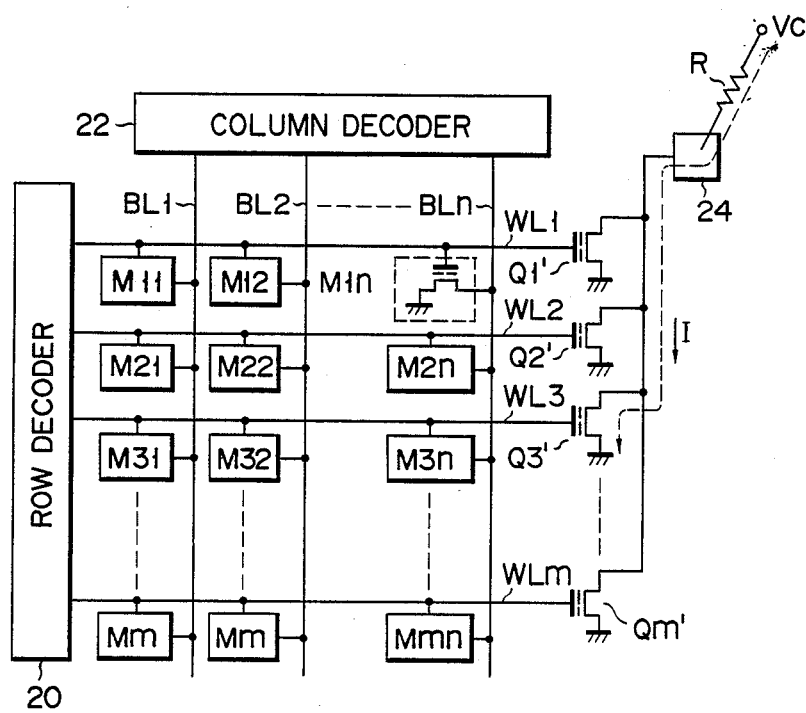
F I G. 2
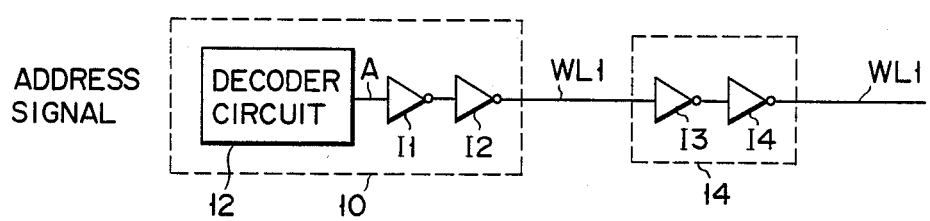
F I G. 3

SEMICONDUCTOR MEMORY DEVICE WITH A CIRCUIT FOR ANALYZING DEFECTS IN WORD-LINES

BACKGROUND OF THE INVENTION

1. Field of the Invention

The present invention relates to a semiconductor memory device, and, in particular, to a semiconductor memory device including a circuit for analyzing defects in word-lines.

2. Description of the Related Art

Generally, a semiconductor memory device includes a memory cell array in which memory cells are arranged at intersections of word-lines and bit-lines. Data is written in or read out from a given memory cell within the memory cell array, when the word-line and the bit-line connected to the memory cell in question are selected by a row decoder and a column decoder.

The selection of word-lines is performed by the row decoder for decoding row address signals. The row decoder includes a plurality of word-line drive circuits for setting the potential of a selected word-line to a predetermined value, in addition to a plurality of decoding circuits for decoding row address signals.

Recently, there has been considerable demand for a large-capacity, high-speed semiconductor memory device, and to meet such demand, each memory cell of the memory device has been miniaturized. In addition, minimum design size for a transistor has been reduced. Since the area of each memory cell is a most important factor in determining the area of a chip, the pattern of memory cells has been designed in accordance with minimum design size.

Since the arrangement of word-lines is determined by the arrangement of the memory cells, the pitch of the word-lines becomes narrower as the pattern area of each memory cell is reduced. The decoding circuits and drive circuits need to be arranged on the chip at a pitch corresponding to the arrangement of memory cells, due to the fact that each word-line requires one decoding circuit and one word-line drive circuit. Since most of the area of a chip is taken up by the memory cells and by the decoding and drive circuits, therefore these circuits are normally formed in accordance with minimum design size.

However, when a circuit is designed on this basis, defects are likely to occur in the elements thereof, even when a mask-alignment is slightly displaced during the manufacturing process. Such defects may lead to malfunctions. In particular, since the decoding circuits and the word-line drive circuits include a great number of elements, compared to other peripheral circuits, there is a great possibility that defects may occur in these two circuits.

For example, when a short circuit, a leakage, or an imperfect contact occurs between a gate and a substrate in a transistor constituting a decoding circuit or a word-line drive circuit, the potential of the word-line may be fixed to "L" level. Normally, this potential is set at "H" level in the selected state, and at "L" level in the non-selected state. Memory cells connected to a defective word-line will always be kept in the nonselected state, preventing normal memory access.

In some cases, the logic levels "H" and "L" may be reversed owing to defects in elements of the decoding circuits and the drive circuits, and may result in a word-line, which should correctly be set in the nonselected state, being erroneously set in the selected "H" state. In such a case, memory cells connected to the defective word-line as well as those connected to the normal word-line may be selected, preventing normal data access.

As stated above, in a highly integrated semiconductor memory device, a word-line which should correctly be in the selected state may be set at the potential of the non-selected state, while a word-line which should correctly be in the non-selected state may be set at the potential of the selected state. Consequently, the greater the capacity and integration density of the memory device, the greater the possibility of such malfunctions occurring.

Defective word lines in an initial produce development stage are more likely to be defective because of immature manufacturing techniques. In order to find defective elements, it is necessary to measure levels at nodes within the decoding circuit and the word-line drive circuit by use of an electron beam tester, or to write a special data pattern in the memory device. However, such a defect-finding process is time consuming and inefficient, and inevitably results in a memory device of high manufacturing cost.

SUMMARY OF THE INVENTION

The object of the present invention is to provide a semiconductor memory device which can quickly and easily detect defects in word-lines, and is suitable for enlargement of memory capacity and for advancement of integration.

The semiconductor memory device of the present invention comprises a memory cell array including a plurality of memory cells, a row decoder and a column decoder for selecting word-lines and bit-lines in accordance with address signals, and a plurality of transistors having gates connected to the word-lines, sources connected to a fixed potential terminal, and drains connected commonly to a pad.

In this semiconductor memory device, the switching state of the transistor corresponding to the selected word-line is determined by means of whether or not the selected word-line is correctly activated. Therefore, by sequential selection of the word-lines, defects therein can be easily detected.

BRIEF DESCRIPTION OF THE DRAWINGS

FIG. 1 is a block diagram showing a semiconductor memory device according to a first embodiment of the present invention;

FIG. 2 is a block diagram showing a semiconductor memory device according to a second embodiment of the present invention and FIG. 3 is a block diagram showing a structure of a row decoder for one word-line, which is applied to the semiconductor memory devices of FIGS. 1 and 2.

DETAILED DESCRIPTION OF THE PREFERRED EMBODIMENT

FIG. 1 shows a semiconductor memory device according to a first embodiment of the present invention. This memory device is a mask ROM having memory cells Mll to Mmn, which are provided at intersections of word-lines WL1 to WLm and bit-lines BL1 to BLn. Each memory cell includes one N-type MOS transistor, the gate of each of which is connected to a corresponding one of word-lines WL1 to WLm, while the drains of only those transistors preselected by a write-in program are connected to corresponding bit-lines BL1 to BLn, the remaining drains being electrically isolated from the bit lines.

Row decoder 20 and column decoder 22 select one word-line and one bit-line, respectively, in accordance with address signals, and when the drain of the cell transistor provided at the intersection of the selected word-line and bit line is connected to the bit line, the potential of that bit-line is lowered to "L" level via the transistor. On the other hand, when the drain of the cell transistor provided at the intersection of the selected word-line and bit-line is not connected to the bit-line, the potential of the bit-line is unchanged, i.e. at "H" level or at a precharged potential.

Word-lines WLI to WLm are connected to the gates of N-type MOS transistors Q1 to Qm, the sources of these transistors being connected to a ground potential supply terminal, the drains thereof being connected commonly to a given pad 24.

Pad 24 is formed within a semiconductor chip to detect defects in word-lines WL1 to WLm. For detecting a defect in a word line, the probe of a tester is placed in contact with pad 24, as is illustrated in FIG. 1, in which it can also be seen that pad 24 is connected to external power source VC via resistor R.

When, for example, word-line WL3 is selected by row-decoder 20, it is set at "H" level, as a result of which transistor Q3, connected to word-line WL3, is turned on, allowing current I to flow from external power source VC to a ground terminal through resistor R, pad 24, and transistor Q3. Current I causes a voltage drop across resistor R, enabling the value of current I to be detected on the basis of the voltage drop.

When, on the other hand, a defective word-line, which is fixed to "L" level, is selected, transistors Q1 to Qm are all turned off, a current is not allowed to flow from external power source VC, no voltage drop occurs in resistor R, therefore a defective word-line can be easily detected by scanning row addresses and sequentially selecting the word-lines.

When the potential of the selected word-line is not set to "H" level but to an intermediate level, the gate voltage of the transistor connected to the wordline falls and the conductance (gm) of the transistor also falls. Consequently, the amount of current flowing from external power source VC to the ground terminal decreases, as does the voltage drop in resistor R. Thus, by detecting the value of the voltage drop in resistor R, the voltage applied to the gate of the transistor can be guessed, and the level of the defect of the word-line can be estimated.

A description will now be made of the case where a defective word-line, which is fixed to the "H" level, is selected. When a non-defective word-line is selected, not only is the transistor connected to the selected word-line turned on, but also the transistor connected to the defective word-line. Because two transistors—and not one—are turned on, the amount of current supplied from external power source VC is increased. When the defective word-line is selected, the number of transistors which are turned on is only one. Thus, the amount of the current supplied from external power source VC decreases, compared to the case where the non-defective word-line is selected. If the voltage drop in resistor R is monitored by sequentially selecting the word-lines, a word-line having a defect can be easily detected.

FIG. 2 shows a second embodiment of the semiconductor memory device of the present invention. This memory device is an erasable programmable read-only memory (EPROM) each memory cell of which includes a floating-gate type MOS transistor. The control gate of each MOS transistor is connected to a corresponding word-line, while the drain thereof is connected to a corresponding bit-line, and the source thereof is connected to the ground. Word-lines WL1 to WLm are connected to the control gates of floating-gate type MOS transistors Q1' to Qm', the sources of these transistors being connected to the ground voltage supply terminal, the drains thereof being connected commonly to pad 24. No electrons are injected into the flating gates of transistors Q1' to Qm', and a given one of the transistors is turned on when the word-line corresponding thereto is set at "H" level, and is turned off when the corresponding word-line is set at "L" level.

In this manner, defects in word-lines of the EPROM can be detected, as in the first embodiment.

In the second embodiment, it is possible to use N-type MOS transistors, like in the first embodiment, in place of floating-gate type MOS transistors Q1' to Qm'.

FIG. 3 shows a section of row decoder 20 shown in FIGS. 1 and 2, which corresponds to one word-line WL1. Decoding circuit 12 decodes an address signal, and sets the potential of node A to "H" or "L" level, in accordance with the decoded result. Inverters I1 and I2, which are cascade-connected, constitute a word-line drive circuit, and drive word-line WL1. Intermediate buffer 14, which includes cascade-connected inverters 13 and 14, is provided midway along word-line WLI on an as-needed-basis.

The potential of node A is fixed to "H" level or "L" level if a defect occurs in the elements within decoding circuit 12. In this case, word-line WLI is fixed to "H" level or "L" level, irrespective of the decoded result of decoding circuit 12. Such a defect occurring in word-line WL1 can easily be detected with the structure of the first embodiment or the second embodiment.

While the above description of the invention relates specifically to its use in a mask ROM and an EPROM, the invention can, however, also be used to detect defects in word-lines in a dynamic RAM and a static RAM.

What is claimed is:

1. A semiconductor memory device comprising:
   a memory cell array including a plurality of memory cells;
   a plurality of word-lines, each word-line connected to corresponding memory cells;
   a plurality of bit-lines, each bit-line connected to corresponding memory cells;
   a row decoder connected to the plurality of word-lines for selecting word-lines in accordance with address signals and a column decoder connected to the plurality of bit-lines for selecting bit-lines in accordance with address signals; and
   a plurality of transistors connected in parallel between a predetermined potential supply terminal and a pad, each of said plurality of transistors having a gate connected to a corresponding word-line, each of said plurality of transistors being switch-controlled in accordance with a potential of said corresponding word-line.

2. The semiconductor memory device according to claim 1, wherein each of said memory cells includes a transistor of the same type as each of said plurality of transistors.

3. The semiconductor memory device according to claim 2, wherein each of said memory cells includes an N-channel type MOS transistor, and each of said plurality of transistors is an N-channel type MOS transistor.

4. The semiconductor memory device according to claim 2, wherein each of said memory cells includes a floating-gate type MOS transistor, and each of said plurality of transistors is a floating-gate type MOS transistor.

5. The semiconductor memory device according to claim 1, wherein said pad is provided within a chip in which said semiconductor memory device is formed.

6. The semiconductor memory device according to claim 1, wherein said row detector includes means for decoding a row address signal supplied from an external device to thereby select one of said word-lines.

* * * * *